United States Patent [19]
Daniel, Jr.

[11] 4,213,096
[45] Jul. 15, 1980

[54] PHASELOCK RECEIVER WITH PHASELOCK DETECTOR

[75] Inventor: James W. Daniel, Jr., Camden, N.J.

[73] Assignee: RCA Corporation, New York, N.Y.

[21] Appl. No.: 900,129

[22] Filed: Apr. 26, 1978

[51] Int. Cl.² .............................................. H04B 1/16
[52] U.S. Cl. .................................. 455/260; 329/124; 331/4; 455/265
[58] Field of Search .................... 325/419–423, 325/346, 470, 329, 330, 320, 60; 331/4, 17, 25; 329/50, 122, 123, 124; 307/222 R

[56] References Cited

U.S. PATENT DOCUMENTS

| | | | |
|---|---|---|---|
| 2,833,923 | 5/1958 | Gruen | 331/4 |
| 3,160,815 | 12/1964 | Ford et al. | 325/420 |
| 3,290,611 | 12/1966 | Horlacher et al. | 307/222 R |
| 3,311,442 | 3/1967 | De Jager et al. | 325/60 |
| 3,768,030 | 10/1973 | Brown et al. | 325/423 |
| 3,940,695 | 2/1976 | Sickles | 325/421 |
| 4,004,231 | 1/1977 | Elshuber | 325/420 |

FOREIGN PATENT DOCUMENTS 1374638  11/1974  United Kingdom ................. 331/4

*Primary Examiner*—Robert L. Griffin
*Assistant Examiner*—Jin F. Ng
*Attorney, Agent, or Firm*—Samuel Cohen; Carl V. Olson

[57] ABSTRACT

A phaselock loop in a phaselock receiver includes a voltage-controlled oscillator, and a main phase detector receptive to an output of the oscillator and a received signal. Means to detect when the oscillator is phase locked with the received signal includes a quadrature phase detector receptive to a quadrature-phase-shifted oscillation from the oscillator and the received signal. Means are provided to subtract the direct-current component of the output of the main phase detector from the direct-current component of the output of the quadrature phase detector to provide a phaselock-indicating signal which is substantially zero when the oscillator is out-of-lock with the received signal, and which is high when the oscillator is in-lock with the received signal.

5 Claims, 1 Drawing Figure

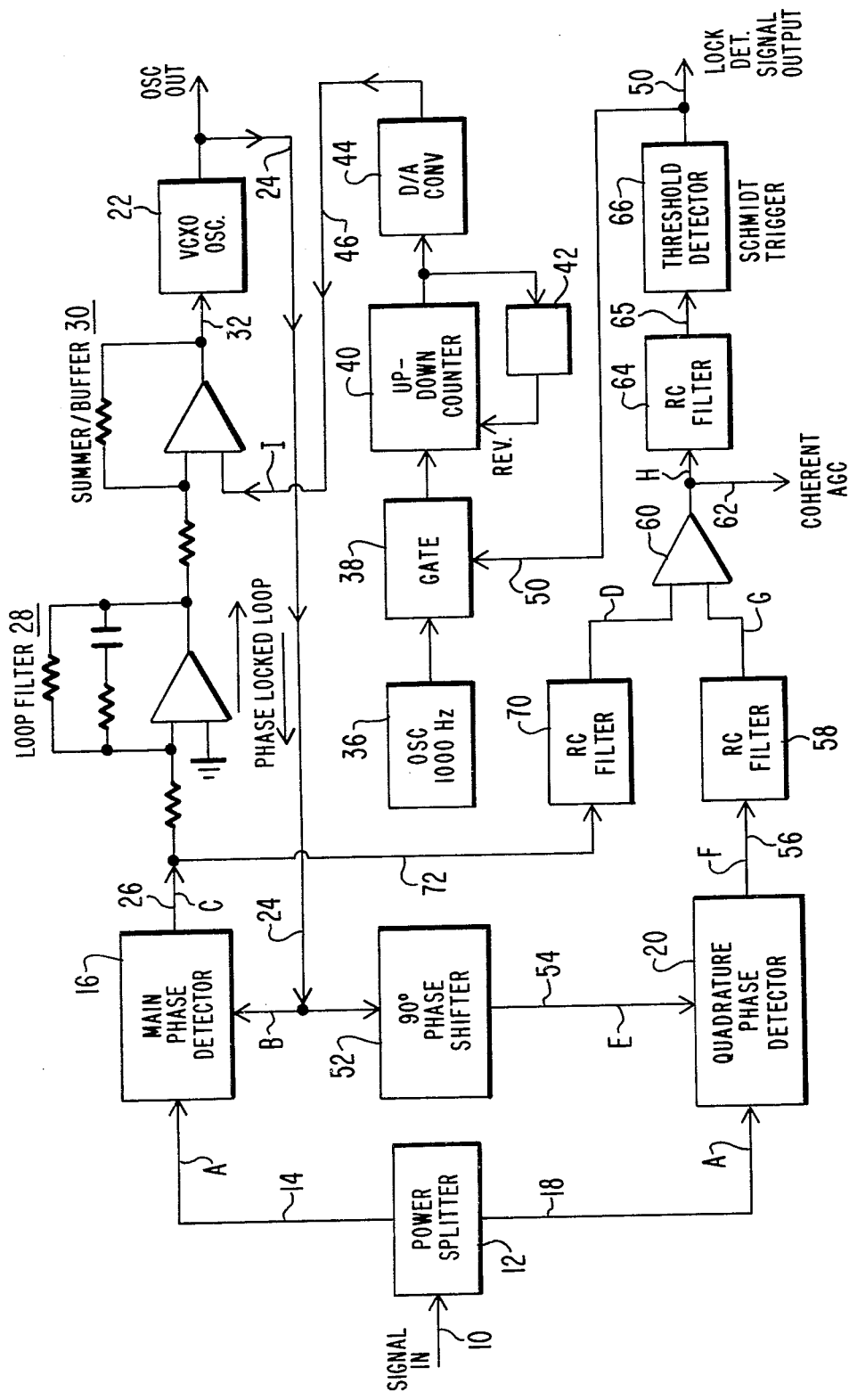

PHASELOCK RECEIVER WITH PHASELOCK DETECTOR

The Government has rights to this invention pursuant to Contract No. DAAB07-76-C-0050 awarded by the Department of the Army.

This invention relates to lock indication means useful in frequency scanning receivers to detect when a local oscillation in the receiver is phase locked with a received signal, and to cause a discontinuance of frequency scanning so long as the phase locked condition obtains.

A prior art method of lock indication employed almost universally is described on pages 52 and 53 of the bood by Floyd M. Gardner entitled "Phaselock Techniques" published 1966 by John Wiley and Sons, Inc. Lock indication is provided by a quadrature phase detector receptive to the received signal and a 90°-phase-shifted version of the output of the local voltage-controlled oscillator. The output of the quadrature phase detector after passing through a smoothing filter is a high voltage when the receiver is phase-locked, and is a low voltage when the receiver is out-of-lock. However, the low voltage output is not a zero voltage when the receiver is out-of-lock, and distinguishing between the high voltage output and the low voltage output may be impossible under poor signal-to-noise conditions. The low voltage output during the out-of-lock condition is due to a direct-current component in the asymmetrical beat frequency at the output of the quadrature phase detector. Imperfectly balanced diodes in the phase detector also may cause a small direct-current component, which varies with temperature, at the output of the phase detector.

According to an example of this invention, a phaselock detector is provided which produces a substantially zero output when the local oscillator is out of phase with a received signal. The output of the main phase detector in the phaselock loop is subtracted from the output of a quadrature phase detector to cancel the direct-current components due to asymmetrical beat frequencies in the outputs of the main and quadrature phase detectors.

In the drawing:

The sole FIGURE of the drawing is a block diagram of a portion of a phaselock receiver including a phaselock detector.

Referring now in detail to the drawing, a signal input line 10 for receiving a signal, such as a 70 MHz signal transmitted from a satellite, is applied to a power splitter 12 having a one output 14 connected to the signal input of a main phase detector 16, and has a second output 18 for coupling an equal strength signal to the signal input of a quadrature phase detector 20. The power splitter 12 may be simply a balun type of transformer by which the input signal is divided into two equal output signals. The phase detectors 16 and 20 may each be a standard 4-diode balanced mixer or phase detector.

The main phase detector 16 is in a phase locked loop which includes a voltage-controlled crystal oscillator 22 having an output 24 coupled to the second input of the main phase detector 16. The phase error signal output at 26 from the phase detector 16 is applied through a loop filter 28 and a summer/buffer 30 to the controlvoltage input 32 of the voltage-controlled crystal oscillator 22. The described phase controlled loop normally operates to maintain the voltage-controlled crystal oscillator 22 in phaselock with an input signal received on input line 10.

When the voltage-controlled crystal oscillator 22 is not locked onto a received signal, the oscillator is swept in frequency over a range such as plus (+) or minus (−) 20 kHz for the purpose of finding and locking onto the frequency and phase of a received signal. The sweeping of the frequency of the oscillator 22 is accomplished by a circuit including a 1000 Hz oscillator 36, a gate 38, an up-down counter 40 including a count-reversing unit 42, and a digital-to-analog converter 44 whch produces a triangular wave on lead 46 that is applied through the summer/buffer 30 to the controlvoltage input 32 of the oscillator 22. The triangular voltage waveform applied to the oscillator 22 causes the output frequency of the oscillator to sweep at a constant rate from a minimum frequency up to a maximum frequency, and to then sweep down at a constant rate to the initial minumum frequency, and so on, as long as the triangular voltage wave input is present. The voltage can be stopped from changing in triangular wave fashion by a signal applied over a line 50 to the gate 38, as will be described.

Means in the system for determining when the voltage-control crystal oscillator 22 is or is not locked onto the input signal includes a 90° phase-shifter 52 receptive to the output at 24 of the oscillator 22, and having an output at 54 for applying a 90°-phase-shifted oscillation to the local oscillator input of the quadrature phase detector 20. The quadrature phase detector 20 may be exactly the same as the main phase detector 16. Detector 20 has an output 56 coupled through a low-pass resistorcapacitor filter 58 which may pass frequencies below 100 Hz to one input of a differential amplifier 60. The output of amplifier 60, whch is also useful in the radio receiver as a coherent AGC signal, is applied through a low-pass resistorcapacitor filter 64 which may pass frequencies up to only 10 Hz. The output of filter 64 is applied to a threshold detector 66 which may be simply a Schmidt trigger.

The output of the threshold detector is applied to control the gate 38 which controls the application of 1000 Hz oscillations to the up-down counter 40. The circuit 42 is conventional in that it includes a decoder which detects when the digital output of the counter 40 reaches a maximum count, and means acting in response thereto, it reverses the direction of the counter so that the counter thereafter counts down. The circuit 42 also includes a second decoder which recognizes when the counter has counted down to zero, and means acting in response thereto to reverse the direction of the counter to cause the counter again to count up. The counter thus counts continuously up and down so long as the oscillations from oscillator 36 are allowed to pass through the gate 38 to the counter 40. If an output for use in performing coherent automatic gain control is not needed at 62, the low-pass filters 58 and 64 can be combined into one filter passing solely the frequencies below about 10 Hz.

It is already known to use a 90° phase shifter 52, a quadrature phase detector 20, and a smoothing low-pass filter 58 for the purpose of providing a lock indication signal which indicates whether or not the local voltagecontrolled oscillator in a receiver is locked onto a received signal. This way of generating a lock detection signal is described on page 52 of the book by Floyd M. Gardner entitled "Phaselock Techniques" published by John Wiley and Sons, Inc. in 1966. A difficulty with the prior art method of generating a lock indicating signal is that the signal at the output of the quadrature phase detector 20 is an asymmetrical beat note having a wave shape as shown in FIG. 4-9 on page 44 of the aforementioned book. The asymmetrical waveform has an undesired direct-current component, which may be at a voltage level of 50 millivolts, and which appears at the output of the low-pass filter 58 when the system is out-of-lock. Under this condition, the lock detection signal should be zero volts so that the threshold detector 66 can be set to respond to a slightly higher voltage which is produced when the system is in-lock. Because of the undesired directcurrent component due to the asymmetrical wave from detector 20, the threshold of the threshold detector 66 must be set undesirably high, and as a consequence, the system may fail to lock onto an input signal under noisy conditions.

The inadequate sensitivity of the prior art arrangement is overcome according to the present invention by the use of a low-pass resistor-capacitor filter 70, like filter 58, passing frequencies below 100 Hz. The filter 70 is receptive over line 72 to the output from the main phase detector 16, and the filter 70 supplies an output to a second input of the differential amplifier 60. When the system is out-of-lock, the output of the main phase detector 16 is an asymmetrical beat note wave which, after passing through filter 70, appears as a small direct-current component of about 50 millivolts, just the same as the output from filter 58 which is receptive to the output of the quadrature phase detector 20. The small direct-current component produced at the output of filter 70 is subtracted in differential amplifier 60 from the similar equal small directcurrent component produced at the output of filter 58. Accordingly, the output of differential amplifier 60, and the signal at 65, is substantially zero volts when the system is out-of-lock, and is a high direct-current voltage when the system is in-lock.

The operation of the system shown in the drawing is summarized in the followig Table wherein signal conditions at points A through I shown in the drawing are given for the out-of-lock condition and the in-lock condition.

TABLE

|  | OUT-OF-LOCK CONDITION | IN-LOCK CONDITION |
|---|---|---|
| A. Input Signal | Sine Wave | Sine Wave |
| B. 0° Osc. | Sweeping Frequency | Cosine Wave |
| C. Main φ Det. Output | Asymmetrical Beat Freq. | Zero Voltage |
| D. Main Filtered Output | Small D.C. Component | Zero Voltage |
| E. 90° Osc. | Sweeping Frequency | Sine Wave |
| F. Quad φ Det. Output | Small D.C. Component | Large D.C. Voltage |
| G. Quad. Filtered Output | Small D.C. Component | Large D.C. Voltage |
| H. Lock Detector Output | G − D = Zero Volts | G − D = Large Voltage |
| I. Freq. Control Voltage | Triangular Wave | Constant Voltage |

It is seen that at A a sine wave corresponding to the input signal is applied to both the main phase detector 16 and the quadrature detector 20. At B, the oscillator input to the phase detector 16 is a continuously sweeping frequency when the system is out-of-lock, and the output at C of the main phase detector is an asymmetrical beat frequency. The asymmetrical signal, after passing through filter 70 to B, is a small direct-current component signal. The 90°-phase-shifter oscillation at input E to the quadrature phase detector 20 is a sweeping frequency when the system is out-of-lock which produces an asymmetrical beat frequency at F that results at the output G of filter 58 in a small direct-current component signal. The output of differential amplifier 60 at H is the difference between the signals at D and G, and is equal to zero volts. This zero-volt signal is below the threshold of threshold detector 66 and no output is produced at 50, thus indicating that the system is out-of-lock. The gate 38 is maintained in an enabled condition so that the oscillations from oscillator 36 pass on to the up-down counter 40. The resulting triangular wave I at the output of the A/D converter 44 causes a periodic sweeping of the frequency of oscillator 22.

The Table also describes the signals at A through I during the in-lock condition. The oscillation at B is now a cosine wave, and the output at C of the main phase detector 16 is zero volts, which continues to be zero volts at the output D of filter 70. During the in-lock condition, the input E to the quadrature phase detector 20 is a sine wave (the same as the input signal wave), and the output F of the quadrature phase detector 20 is a large D.C. voltage, which continues to appear at the output G of filter 58. The signal G minus D appearing at the output H of the differential amplifier 60 is therefore a large D.C. voltage which operates the threshold detector 66 and causes a phase-lock-indicating signal at 50. The lock-indicating signal disables the gate 38, thereby stopping the operation of the up-down counter 40. Thereafter, the count in the counter remains constant, the voltage I from the digital-to-analog converter 44 remains constant, and this constant voltage is applied to the voltage-controlled oscillator 22 to maintain the oscillator 22 at fixed frequency which equals the frequency and phase of the input signal at 10. The receiver is then in a condition to receive and demodulate the intelligence on the signal received at 10. It will be understood that the phase locked loop may include frequency dividers, so that the frequency of the oscillator 22 when the system is locked will an integral multiple of the received signal, rather than the exactly same frequency as the received signal.

It is thus apparent that the arrangement according to the invention is one which produces a lock detection signal having a substantially zero voltage level when the phase lock loop is out-of-lock, and which produces a high voltage when the system is in-lock. The system has been found to operate reliably over a temperature range from −32° C. to ±65° C. under severely unfavorable signal-to-noise conditions with a loop signal-to-noise ratio of 2 db.

What is claimed is:

1. A phaselock receiver including a phaselock detector, comprising
   a phase lock loop including a voltage-controlled oscillator, and a main phase detector receptive to an output of said oscillator and a received signal,
   a 90° phase shifter receptive to an output of said oscillator,
   a quadrature phase detector receptive to a quadraturephase-shifted oscillation from said phase shifter and said received signal, and
   means to subtract the direct-current component of the output of said main phase detector from the direct-current component of the output of said quadrature phase detector to provide a phaselock-indicating signal which is substantially zero when the oscillator is out-of-lock with the received signal.

2. A phaselock receiver according to claim 1 wherein said means to subtract direct-current components includes a differential amplifier, and low-pass filters coupling outputs of the respective phase detectors to inputs of the amplifier.

3. A phaselock receiver according to claim 2, and in addition, means to generate a scanning voltage and apply it to said voltage-controlled oscillator to sweep the frequency of the oscillator back and forth, and means responsive to the phaselock-indicating signal from said differential amplifier to stop the scanning voltage from changing.

4. A phaselock receiver according to claim 3 wherein scanning voltage has a triangular waveform.

5. A phaselock receiver according to claim 3 wherein said means to generate a scanning voltage includes an oscillator, an up-down counter receptive to the output of said oscillator, means to reverse the up-down counter when it reads a minimum count and when it reads a maximum count, and a digital-to-analog converter receptive to the output of the up-down counter.

* * * * *